US012581861B2

(12) United States Patent
Yueh et al.

(10) Patent No.: US 12,581,861 B2
(45) Date of Patent: Mar. 17, 2026

(54) ACOUSTIC WAVE TRANSMITTING STRUCTURE AND DISPLAY DEVICE THAT MAINTAIN HIGH SOUND INTENSITY

(71) Applicant: Innolux Corporation, Miao-Li County (TW)

(72) Inventors: Jui-Jen Yueh, Miao-Li County (TW); Kuan-Feng Lee, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 561 days.

(21) Appl. No.: 17/506,704

(22) Filed: Oct. 21, 2021

(65) Prior Publication Data

US 2022/0158072 A1     May 19, 2022

(30) Foreign Application Priority Data

Nov. 19, 2020    (CN) .......................... 202011303994.6

(51) Int. Cl.
| | |
|---|---|
| *H01L 41/083* | (2006.01) |
| *H01L 41/047* | (2006.01) |
| *H01L 41/08* | (2006.01) |
| *H10N 30/00* | (2023.01) |
| *H10N 30/50* | (2023.01) |
| *H10N 30/87* | (2023.01) |

(52) U.S. Cl.
CPC ........... *H10N 30/50* (2023.02); *H10N 30/706* (2024.05); *H10N 30/874* (2023.02)

(58) Field of Classification Search
CPC . H10N 30/50; H10N 30/874; H10N 30/10513
USPC ...................................................... 310/313 R
See application file for complete search history.

(56) References Cited

U.S. PATENT DOCUMENTS

| | | | |
|---|---|---|---|
| 2020/0192545 A1 | 6/2020 | Oh et al. | |
| 2020/0322707 A1 | 10/2020 | Noh et al. | |

(Continued)

FOREIGN PATENT DOCUMENTS

| | | |
|---|---|---|
| CN | 109240550 | 1/2019 |
| CN | 110287871 | 9/2019 |
| KR | 20190070749 | 6/2019 |

OTHER PUBLICATIONS

"Office Action of China Counterpart Application", issued on Dec. 24, 2024, p. 1-p. 9.

*Primary Examiner* — Emily P Pham
*Assistant Examiner* — Monica Mata
(74) *Attorney, Agent, or Firm* — JCIPRNET

(57) ABSTRACT

An acoustic wave transmitting structure and a display device are provided. The acoustic wave transmitting structure includes a first layer, a second layer, and an intermediate layer. The first layer has a first acoustic impedance Z1. The second layer has a second acoustic impedance Z2. The intermediate layer is disposed between the first layer and the second layer, and has a third acoustic impedance Z3. Z1, Z2, and Z3 satisfy a relation: $(Z1+Z2)/6.8 \leq Z3 \leq (Z1+Z2)/0.6$. The display device includes a display panel and an acoustic wave generator. The display panel has a substrate. A plurality of display elements are disposed on one side of the substrate. The acoustic wave generator is disposed on the other side of the substrate of the display panel through the acoustic wave transmitting structure. The other side of the substrate is opposite to the one side of the substrate.

7 Claims, 8 Drawing Sheets

(56) References Cited

U.S. PATENT DOCUMENTS

2020/0401187  A1      12/2020  Noh et al.
2020/0404427  A1      12/2020  Shin et al.
2021/0303814  A1 *     9/2021  Liu .................... G06V 40/1347
2021/0377670  A1 *    12/2021  Strohmann ........... G06F 1/1626

* cited by examiner 200      330(300)      200a      330a(300a)

10e 200      330(300)      200a      330a(300a)

10f 200    330(300)    200a    330a(300a)

10g 200    330(300)    200a    330a(300a)

10h

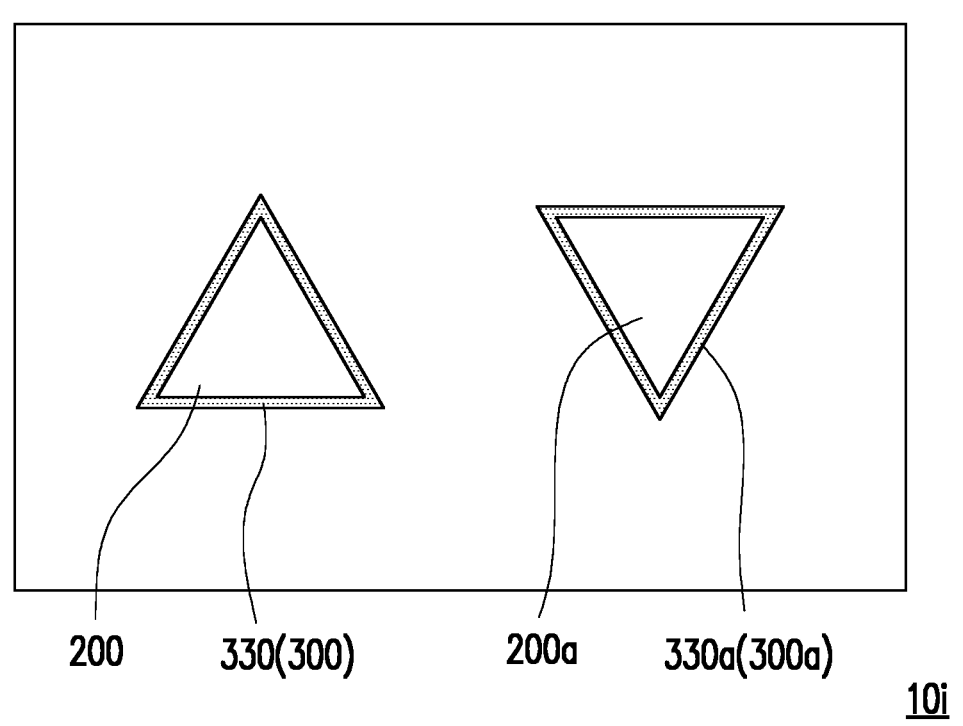
200    330(300)    200a    330a(300a)
10i
FIG. 6E
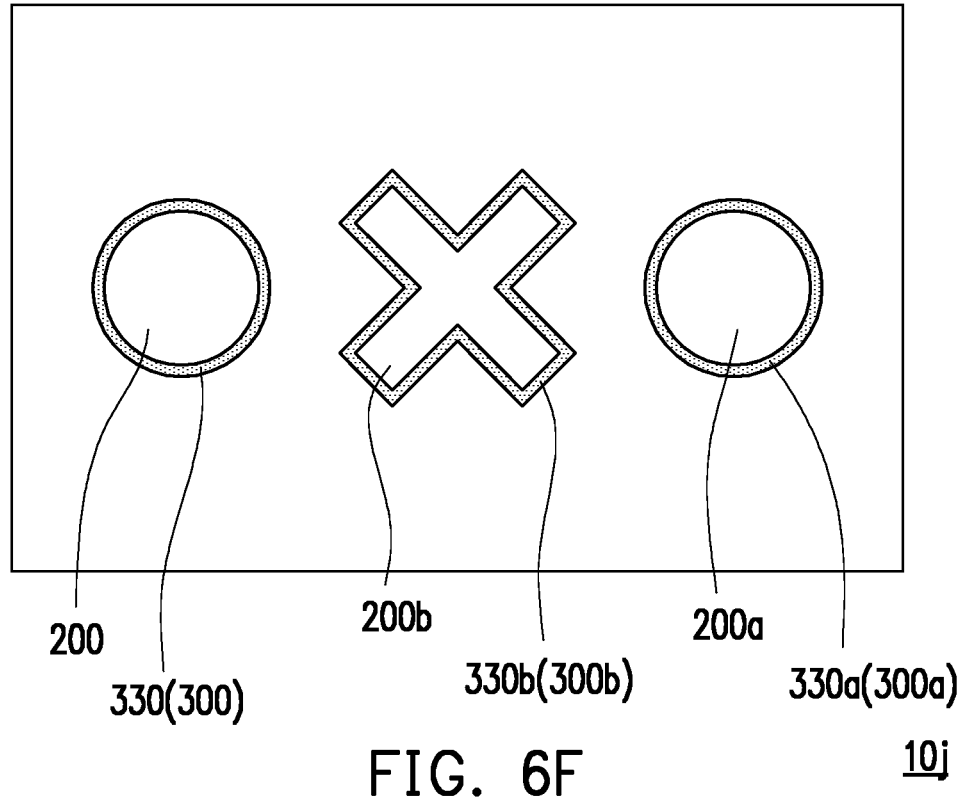
200    200b    200a
330(300)    330b(300b)    330a(300a)
FIG. 6F    10j

ACOUSTIC WAVE TRANSMITTING STRUCTURE AND DISPLAY DEVICE THAT MAINTAIN HIGH SOUND INTENSITY

CROSS-REFERENCE TO RELATED APPLICATION

This application claims the priority benefit of Chinese application no. 202011303994.6, filed on Nov. 19, 2020. The entirety of the above-mentioned patent application is hereby incorporated by reference herein and made a part of this specification.

BACKGROUND

Technical Field

The disclosure relates to an acoustic wave transmitting structure and a display device; more particularly, the disclosure relates to an acoustic wave transmitting structure and a display device that maintain high sound intensity.

Description of Related Art

Display panels have been widely applied in electronic devices such as mobile phones, televisions, monitors, tablet computers, automobile displays, wearable devices, and desktop computers. With the booming development of electronic products, consumers require increasingly higher display quality of the electronic products, so that electronic devices for displaying are continuously improving toward a display effect that is larger or has a higher resolution. In addition, the consumers also require an increase in the quality of sound components in the electronic products. Therefore, improvement of the sound components in the display products is an urgent issue to be addressed.

SUMMARY

The disclosure provides an acoustic wave transmitting structure and a display device that maintain high sound intensity.

According to an embodiment of this disclosure, the acoustic wave transmitting structure includes a first layer, a second layer, and an intermediate layer. The first layer has a first acoustic impedance Z1. The second layer has a second acoustic impedance Z2. The intermediate layer is disposed between the first layer and the second layer, and has a third acoustic impedance Z3. Z1, Z2, and Z3 satisfy a relation: $(Z1+Z2)/6.8 \le Z3 \le (Z1+Z2)/0.6$.

According to an embodiment of this disclosure, the display device includes a display panel and an acoustic wave generator. The display panel has a substrate. A plurality of display elements are disposed on one side of the substrate. The acoustic wave generator is disposed on the other side of the substrate of the display panel through the acoustic wave transmitting structure. The other side of the substrate is opposite to the one side of the substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6A to FIG. 6F are schematic bottom views of display devices according to some embodiments of the disclosure.

DESCRIPTION OF THE EMBODIMENTS

Figure 1A:
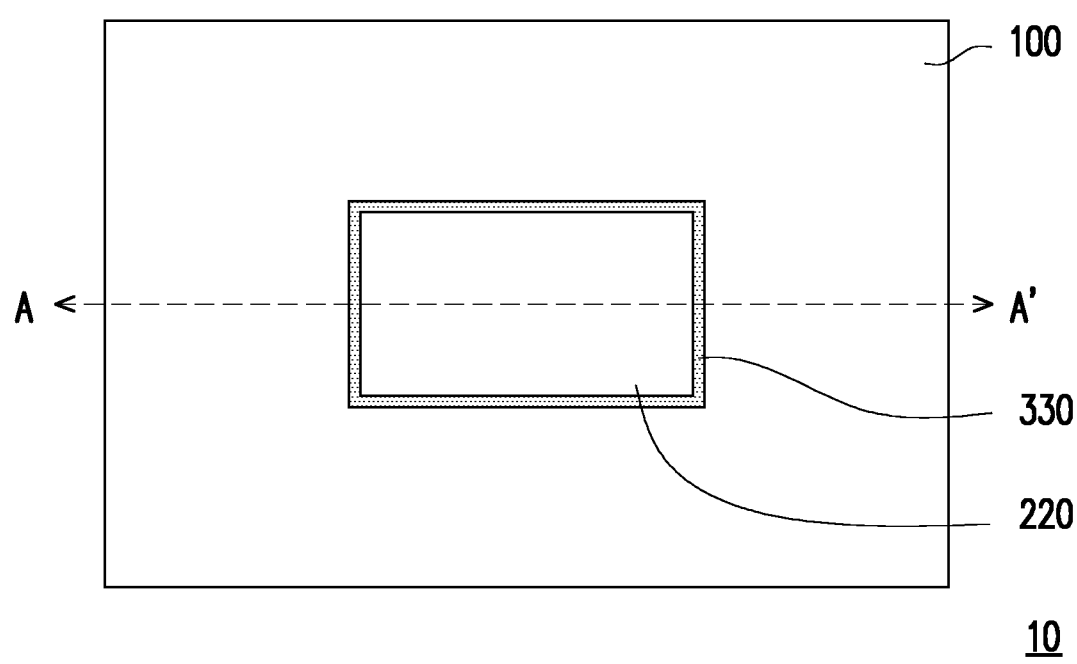
FIG. 1A is a schematic bottom view of a display device according to an embodiment of this disclosure.

The disclosure may be understood with reference to the following detailed description and the accompanying drawings. It should be noted that, for ease of understanding by readers and conciseness of the drawings, a plurality of drawings in the disclosure merely show a part of an electronic device, and specific elements in the drawings are not drawn to scale. In addition, the number and size of each element in the drawings only serve to explain, instead of limiting, the scope of the disclosure.

In the following specification and claims, terms such as "include", "comprise", and "have" are open-ended terms, and should therefore be interpreted as "including, but not limited to".

It should be understood that when an element or film layer is referred to as being disposed "on", or "connected to" another element or film layer, the element or film layer may be directly on or connected to said another element or film layer, or intervening elements or film layers may be present (non-direct circumstances) in between. In contrast, when an element or film layer is referred to as being "directly on" or "directly connected to" another element, no intervening elements or film layers are present in between.

Although terms "first", "second", "third", etc. may be used to describe a plurality of components, the components are not limited by these terms. The terms are merely used to distinguish a single component from other components in the specification. In the claims, it is possible that the same terms are not used but are replaced by "first", "second", "third", etc. based on the sequence in which components are claimed. Therefore, a first component in the following specification may be a second component in the claims.

Herein, the term "about", "approximately", "substantially", or "generally" typically represents that a value is in a range within 10% of a given value, or a range within 5%, 3%, 2%, 1%, or 0.5% of a given value. The given value specified herein is an approximate value; that is, it connote the meaning of "about", "approximately", "substantially", or "generally" even in the cases where "about", "approximately", "substantially", or "generally" is not particularly described. In addition, the descriptions "a range is from a first value to a second value" and "a range is between a first value and a second value" indicate that the range includes the first value, the second value, and other values in between.

In some embodiments of the disclosure, terms related to bonding and connection such as "connect", "interconnect", etc., unless specifically defined, may indicate the case where two structures are in direct contact, or where two structures are not in direct contact with other structures disposed in between. Besides, the terms related to bonding and connection may also cover a case where two structures are both movable or two structures are both fixed. Moreover, the term "electric connect" and "couple" include any direct and indirect electrical connection means.

In the disclosure, the electronic device may include, but is not limited to, a display device, an antenna device, a sensing device, a touch display, a curved display, or a free shape display. The electronic device may be a bendable or flexible electronic device. The electronic device may include, for example but is not limited to, a light-emitting diode (LED), a liquid crystal, fluorescence, a phosphor, a quantum dot (QD), other suitable display media, or a combination of the above. The light-emitting diode may include, for example but is not limited to, an organic light-emitting diode (OLED), an inorganic light-emitting diode, a mini light-emitting diode (mini LED), a micro light-emitting diode (micro LED), a quantum dot light-emitting diode (QLED or QDLED), other suitable materials, or any combination of the above. In addition, the display device may include, for example but is not limited to, a spliced display device. The antenna device may include, for example but is not limited to, a liquid crystal antenna device. The antenna device may include, for example but is not limited to, a spliced antenna device. It should be noted that the electronic device may include, for example but is not limited to, any combination of the above. Moreover, a shape of the electronic device may include a rectangle, a circle, a polygon, a shape with curved edges, or other suitable shapes. The electronic device may include a peripheral system such as a driving system, a control system, a light source system, a shelf system, etc. to support the display device, the antenna device, or the spliced device. Hereinafter, a display device will be used to explain the disclosure. Nonetheless, the disclosure is not limited thereto.

It should be understood that, in the following embodiments, the features in several different embodiments may be replaced, re-combined, or mixed to complete other embodiments without departing from the spirit of the disclosure. The features between each of the embodiments may be used in any mixture or conjunction as long as they do not depart from or conflict with the spirit of the disclosure.

Reference will now be made in detail to exemplary embodiments of the disclosure, examples of which are illustrated in the accompanying drawings. Wherever possible, the same reference numerals are used in the drawings and descriptions to refer to the same or similar parts.

Figure 1B:
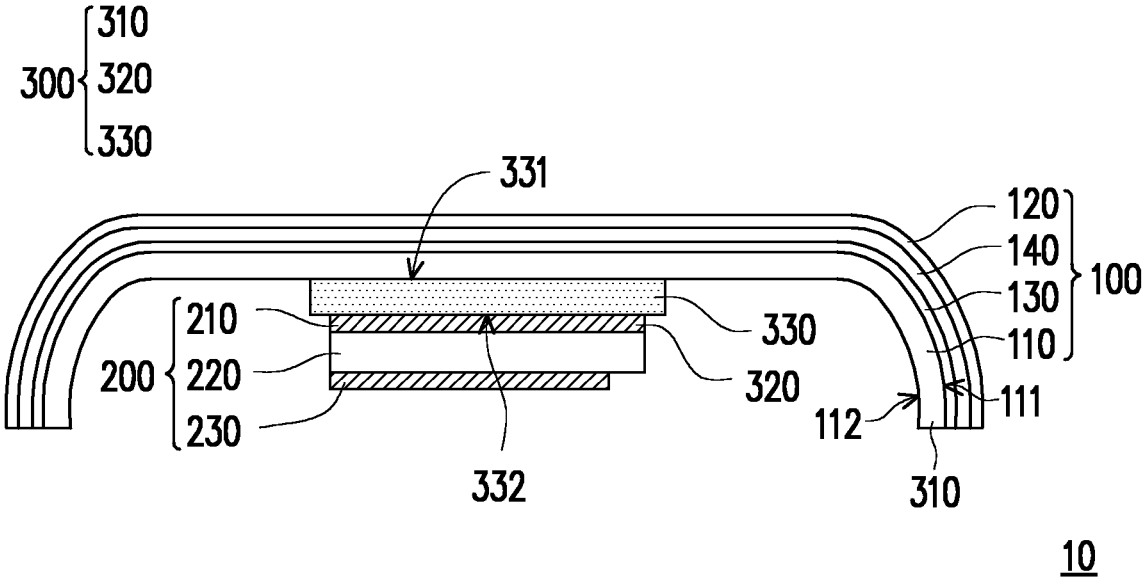
FIG. 1B is a schematic cross-sectional view of the display device of FIG. 1A along sectional line A-A'.

FIG. 1A is a schematic bottom view of a display device according to an embodiment of this disclosure. FIG. 1B is a schematic cross-sectional view of the display device of FIG. 1A along sectional line A-A'. For clarity of the drawings and convenience of description, FIG. 1A omits some elements in the display device.

With reference to FIG. 1A and FIG. 1B at the same time, a display device 10 of this embodiment includes a display panel 100 and an acoustic wave generator 200. The display panel 100 has a substrate 110 and a plurality of display elements 120. The plurality of display elements 120 are disposed on one side 111 of the substrate 110. The plurality of display elements 120 includes a pixel structure. Herein, the substrate 110 may include a rigid substrate, a soft substrate, or a combination of the above. For example, a material of the substrate 110 may include, but is not limited to, glass, quartz, sapphire, ceramic, polycarbonate (PC), polyimide (PI), polyethylene terephthalate (PET), other suitable substrate materials, or a combination of the above.

In this embodiment, the acoustic wave generator 200 is disposed on the other side 112 of the substrate 110 of the display panel 100 through an acoustic wave transmitting structure 300. The other side 112 of the substrate 110 is opposite to the one side 111 of the substrate 110. Specifically, the acoustic wave generator 200 has an outer layer (including an outer layer electrode 210 and an outer layer electrode 230) and an inner layer 220. The inner layer 220 is disposed between the outer layer electrode 210 and the outer layer electrode 230. The outer layer electrode 210 and the outer layer electrode 230 are respectively located on two opposite sides of the inner layer 220. The outer layer electrode 210 is adjacent to the other side 112 of the substrate 110, and the outer layer electrode 230 is away from the other side 112 of the substrate 110. In this embodiment, the outer layer electrode 210 and the outer layer electrode 230 may be electrodes of the acoustic wave generator 200, and the materials of the electrodes may include, but are not limited to, Mo, Ti, Ta, Nb, Hf, Ni, Cr, Co, Zr, W, Al, Cu, Ag, other suitable metals, or an alloy or a combination of the above materials. In this embodiment, the inner layer 220 may be a piezoelectric layer of the acoustic wave generator 200, and a material of the piezoelectric layer may include, but is not limited to, barium titanate, strontium titanate, lead titanate, bismuth titanate, lead zirconate titanate, other suitable piezoelectric materials, or a combination of the above materials. Therefore, in the acoustic wave generator 200 of this embodiment, an externally applied voltage may, for example, be conducted through the outer layer electrode 210 and the outer layer electrode 230 to the inner layer 220 of the piezoelectric layer. Due to the input voltage, the inner layer 220 of the piezoelectric layer deforms and generates mechanical vibration at an ultrasonic frequency, thereby generating acoustic wave vibration, and transmitting the acoustic wave through the outer layer electrode 210 to an intermediate layer 330 and the substrate 110.

In this embodiment, the acoustic wave generator 200 transmits an acoustic wave through the outer layer electrode 210 to the intermediate layer 330 and the substrate 110, and therefore, the outer layer electrode 210, the intermediate layer 330, and the substrate 110 may serve as the acoustic wave transmitting structure 300. The acoustic wave transmitting structure as described in this disclosure is namely the medium required for the acoustic wave to pass through during transmission. The acoustic wave transmitting structure may be single-layered or multi-layered, but is not limited thereto. To be specific, the acoustic wave requires to be transmitted through vibration of the medium, which may include, for example, the outer layer electrode 210, the intermediate layer 330, or the substrate 110. In addition, various materials of the medium have various corresponding acoustic impedance values, and the acoustic impedance affects the performance of intensity of acoustic wave. The above-mentioned intensity of acoustic wave is namely sound intensity. To be specific, since an acoustic wave having a first sound intensity emitted by the acoustic wave generator 200 penetrates the intermediate layer 330 through the outer layer electrode 210 before being transmitted to the substrate 110, in the display panel 100, therefore, a magnitude of a second sound intensity may be determined depending on the type of the material that the acoustic wave penetrates. Namely, a volume of a sound emitted by the display panel 100 is affected by the type of the material penetrated by the acoustic wave. In other words, an acoustic impedance compatibility between the outer layer electrode 210, the intermediate layer 330, and the substrate 110 affects the magnitude of the second sound intensity of the acoustic wave after penetrating the acoustic wave transmitting structure 300. That is to say, when the acoustic wave is transmitted through the acoustic wave transmitting structure 300, the final sound intensity of the acoustic wave is affected by whether the acoustic impedance compatibility is appropriate between each of the materials of the medium in the acoustic wave transmitting structure. In this embodiment, the selection of a material of the acoustic wave transmitting structure 300 and the corresponding acoustic impedance is a relatively important factor in the magnitude of the second sound intensity that can be received by the display device 10. The acoustic impedance values corresponding to different materials may be obtained by those skilled in the related art through searching for general common knowledge (e.g., textbooks and websites). Herein, the unit of acoustic impedance is $kg/m^2*sec$.

Specifically, in this embodiment, the acoustic wave transmitting structure 300 may, for example, be a three-layered structure and include a first layer 310, a second layer 320, and the intermediate layer 330. The intermediate layer 330 is disposed between the first layer 310 and the second layer 320. The first layer 310 and the second layer 320 are respectively located on two opposite sides of the intermediate layer 330, and the first layer 310 and the second layer 320 are separated from each other. The first layer 310 is in direct contact with a first surface 331 of the intermediate layer 330, and the second layer 320 is in direct contact with a second surface 332 of the intermediate layer 330. The first surface 331 and the second surface 332 of the intermediate layer 330 are opposite to each other. The acoustic wave is transmitted from the second layer 320 of the acoustic wave transmitting structure 300 through the intermediate layer 330 to the first layer 310. In this embodiment, in the acoustic wave transmitting structure 300, for example, the first layer is the substrate 110 and has a first acoustic impedance Z1, the second layer is the outer layer electrode 210 and has a second acoustic impedance Z2, and the third layer is the intermediate layer 330 and has a third acoustic impedance Z3.

In this embodiment, the acoustic wave emitted by the acoustic wave generator 200 has the first sound intensity, and the acoustic wave after passing through the outer layer electrode 210 and penetrating the intermediate layer 330 and the substrate 110 has the second sound intensity. To be specific, when a ratio of the second sound intensity divided by the first sound intensity is closer to 100%, it is indicated that a difference between the second sound intensity and the first sound intensity is less, and also that a combination of the acoustic wave transmitting structure 300, such as a combination of the materials of the outer layer electrode 210, the intermediate layer 330, and the substrate 110, is less likely to interfere with the sound intensity of the acoustic wave, namely that the acoustic wave transmitting structure 300 maintains high sound intensity. On the contrary, when the ratio of the second sound intensity divided by the first sound intensity is farther from 100%, it is indicated that the difference between the second sound intensity and the first sound intensity is greater, and also that the acoustic wave transmitting structure is more likely to interfere with the sound intensity of the acoustic wave, namely that the acoustic wave transmitting structure does not maintain high sound intensity.

More specifically, in this embodiment, when the ratio of the second sound intensity divided by the first sound intensity is, for example, greater than or equal to 50%, that is, when the second sound intensity after penetrating the acoustic wave transmitting structure 300 is at least half or more of the first sound intensity emitted by the acoustic wave generator 200, the first acoustic impedance Z1, the second acoustic impedance Z2, and the third acoustic impedance Z3 should satisfy a relation: $(Z1+Z2)/6.8 \leq Z3 \leq (Z1+Z2)/0.6$, or $0.6 \leq (Z1+Z2)/Z3 \leq 6.8$. In this embodiment, when the ratio of the second sound intensity divided by the first sound intensity is, for example, greater than or equal to 70%, that is, when the second sound intensity after penetrating the acoustic wave transmitting structure 300 is at least seven tenths or more of the first sound intensity emitted by the acoustic wave generator 200, the first acoustic impedance Z1, the second acoustic impedance Z2, and the third acoustic impedance Z3 should satisfy a relation: $(Z1+Z2)/4.7 \leq Z3 \leq (Z1+Z2)/0.9$, or $0.9 \leq (Z1+Z2)/Z3 \leq 4.7$. In this embodiment, when the ratio of the second sound intensity divided by the first sound intensity is, for example, 90% or more, that is, when the second sound intensity after penetrating the acoustic wave transmitting structure 300 is at least nine tenths or more of the first sound intensity emitted by the acoustic wave generator 200, the first acoustic impedance Z1, the second acoustic impedance Z2, and the third acoustic impedance Z3 should satisfy a relation: $(Z1+Z2)/3.2 \leq Z3 \leq (Z1+Z2)/1.3$, or $1.3 \leq (Z1+Z2)/Z3 \leq 3.2$. In this embodiment, when the ratio of the second sound intensity divided by the first sound intensity is, for example, about 100%, that is, when the second sound intensity after penetrating the acoustic wave transmitting structure 300 is substantially equal to the first sound intensity emitted by the acoustic wave generator 200, the first acoustic impedance Z1, the second acoustic impedance Z2, and the third acoustic impedance Z3 should satisfy a relation: Z3 is equal to $(Z1+Z2)/2$, or $(Z1+Z2)/Z3$ is equal to 2.

Accordingly, it can be known that as the value of $(Z1+Z2)/Z3$ is close to 2, the ratio of the second sound intensity divided by the first sound intensity is close to 100%, and the second sound intensity after penetrating the acoustic wave transmitting structure 300 is substantially equal to the first sound intensity emitted by the acoustic wave generator 200. On the contrary, when the value of $(Z1+Z2)/Z3$ is greater than 6.8 or less than 0.6, the ratio of the second sound intensity divided by the first sound intensity is less than 50%, and the second sound intensity after penetrating the acoustic wave transmitting structure 300 is half or less of the first sound intensity emitted by the acoustic wave generator 200. That is to say, when the acoustic wave transmitting structure 300 may be, for example, a combination of the outer layer electrode 210, the intermediate layer 330, and the substrate 110, and when the acoustic wave emitted by the acoustic wave generator 200 is transmitted through the outer layer electrode 210 and the intermediate layer 330 to the substrate 110, the sound intensity received by the consumer from the display panel 100 may be affected by the first acoustic impedance Z1, the second acoustic impedance Z2, and the third acoustic impedance Z3. In addition, the outer layer electrode 210, the intermediate layer 330, or the substrate 110 made of different materials has different acoustic impedance values. Accordingly, the conjunction of acoustic impedance between the outer layer electrode 210, the intermediate layer 330, and the substrate 110 is relatively important. The disclosure facilitates the appropriate selection of the outer layer electrode 210, the intermediate layer 330, and the substrate 100 in combination to form the acoustic wave transmitting structure 300, reducing a loss caused during transmission of the sound of the display device 10.

For example, when the acoustic wave generator 200 is a piezoelectric material, and when the acoustic wave generator 200 generates an acoustic wave, the acoustic wave is transmitted through the outer layer electrode 210, such as a silver electrode, of the acoustic wave generator 200 to the intermediate layer 330, such as an epoxy adhesive, and then transmitted to the substrate 110, such as a polyethylene terephthalate (PET). The first acoustic impedance Z1 represented by polyethylene terephthalate is, for example, 2852832 g/cm$^2$s, the second acoustic impedance Z2 represented by a cured silver electrode is, for example, 3893975 g/cm$^2$s, and the third acoustic impedance Z3 represented by a cured epoxy adhesive is, for example, 2705447 g/cm$^2$s. At this time, since (Z1+Z2)/Z3 is about 2.5 (i.e., less than 3.2 and greater than 1.3), it can be known that the ratio of the second sound intensity divided by the first sound intensity is 90% or more (about 97%); namely the second sound intensity after penetrating the acoustic wave transmitting structure 300 is at least nine tenths of the first sound intensity emitted by the acoustic wave generator 200. However, in the wave transfer structure 300, when the epoxy adhesive of the intermediate layer 330 is replaced by an optical clear adhesive (OCA), the third acoustic impedance Z3 represented by the cured optical clear adhesive is, for example, 703221 g/cm$^2$s. At this time, since (Z1+Z2)/Z3 is about 9.5 (i.e., greater than 6.8), it can be known that the ratio of the second sound intensity divided by the first sound intensity is less than 50% (about 33%), and the second sound intensity after penetrating the acoustic wave transmitting structure 300 is less than half of the first sound intensity emitted by the acoustic wave generator 200.

In other words, when it is known that in of the wave transfer structure 300, a material of the first layer 310 is polyethylene terephthalate and a material of the second layer 320 is a silver (Ag) electrode, the above-mentioned relation between the first acoustic impedance Z1, the second acoustic impedance Z2, and the third acoustic impedance Z3 may be employed to calculate and obtain a selection range of the third acoustic impedance Z3. If the intended ratio of the second sound intensity divided by the first sound intensity is, for example, greater than or equal to 50%, the selection range of the third acoustic impedance Z3 is (2852832+3893975)/6.8≤Z3≤(2852832+3893975)/0.6. If the intended ratio of the second sound intensity divided by the first sound intensity is, for example, 70% or more, the selection range of the third acoustic impedance Z3 is (2852832+3893975)/4.7≤Z3≤(2852832+3893975)/0.9. If the intended ratio of the second sound intensity divided by the first sound intensity is, for example, greater than or equal to 90%, the selection range of the third acoustic impedance Z3 is (2852832+3893975)/3.2≤Z3≤(2852832+3893975)/1.3. If it is intended that the magnitude of the second sound intensity is, for example, substantially equal to the magnitude of the first sound intensity, the selection range of the third acoustic impedance Z3 is (2852832+3893975)/2.

Figure 3:
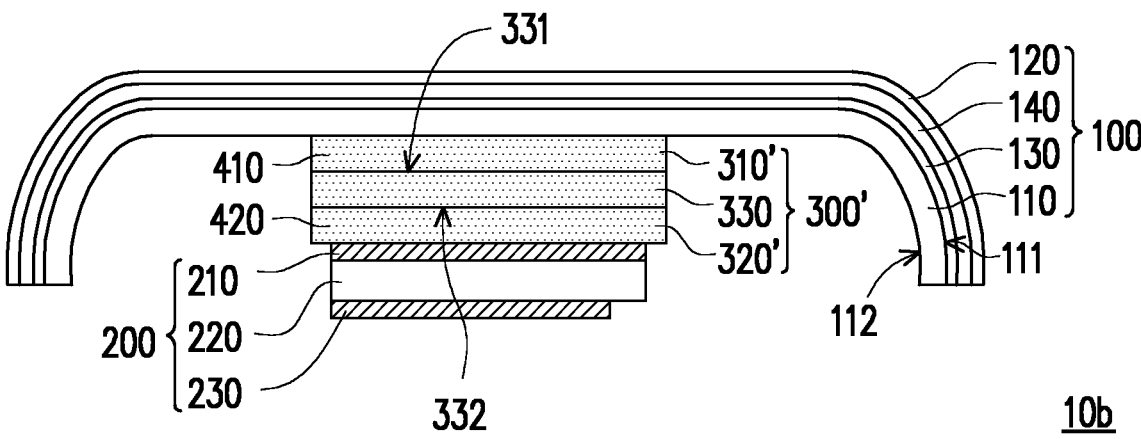
FIG. 3 is a schematic cross-sectional view of a display device according to another embodiment of this disclosure.

In this embodiment, for example, since the substrate 110 of the display panel 100 is in direct contact with the first surface 331 of the intermediate layer 330, and the outer layer electrode 210 of the acoustic wave generator 200 that is adjacent to the intermediate layer 330 is in direct contact with the second surface 332 of the intermediate layer 330, therefore, the substrate 110 of the display panel 100 may serve as the first layer 310 of the acoustic wave transmitting structure 300, and the outer layer electrode 210 of the acoustic wave generator 200 that is adjacent to the intermediate layer 330 may serve as the second layer 320 of the acoustic wave transmitting structure 300. Nonetheless, the disclosure is not limited thereto. That is to say, in some embodiments, for example, if another first film layer other than the substrate is in direct contact with the first surface of the intermediate layer, and another second film layer other than the outer layer is in direct contact with the second surface of the intermediate layer, then the first film layer may serve as the first layer of the acoustic wave transmitting structure, and the second film layer may serve as the second layer of the acoustic wave transmitting structure, as shown in FIG. 3. In this embodiment, a material of the intermediate layer 330 may include, but is not limited to, an epoxy adhesive, an acrylic adhesive, silica gel, other suitable adhesive materials, or a combination of the above materials.

Figure 2:
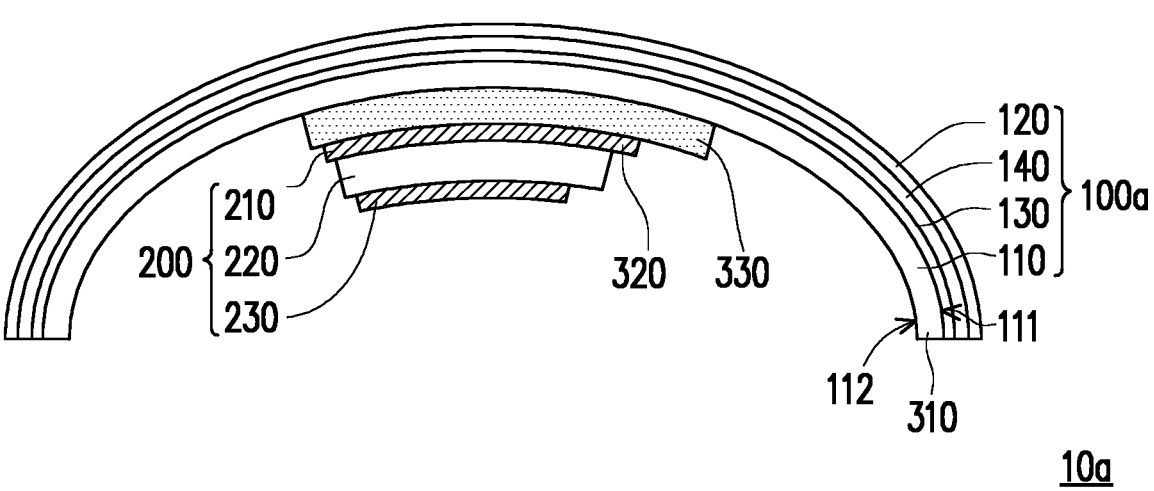
FIG. 2 is a schematic cross-sectional view of a display device according to another embodiment of this disclosure.

In this embodiment, the display panel 100 may also have an adhesive layer 130 and a flexible substrate 140. The adhesive layer 130 is disposed on the one side 111 of the substrate 110, the flexible substrate 140 is disposed on the adhesive layer 130, and the display elements 120 are disposed on the flexible substrate 140. The flexible substrate 140 and the substrate 110 are respectively located on two opposite sides of the adhesive layer 130. The display panel 100 may be a bendable display panel or a flexible display panel, but is not limited thereto. In some embodiments, the display panel may also be a curved display panel, as shown in FIG. 2.

Figure 5A:
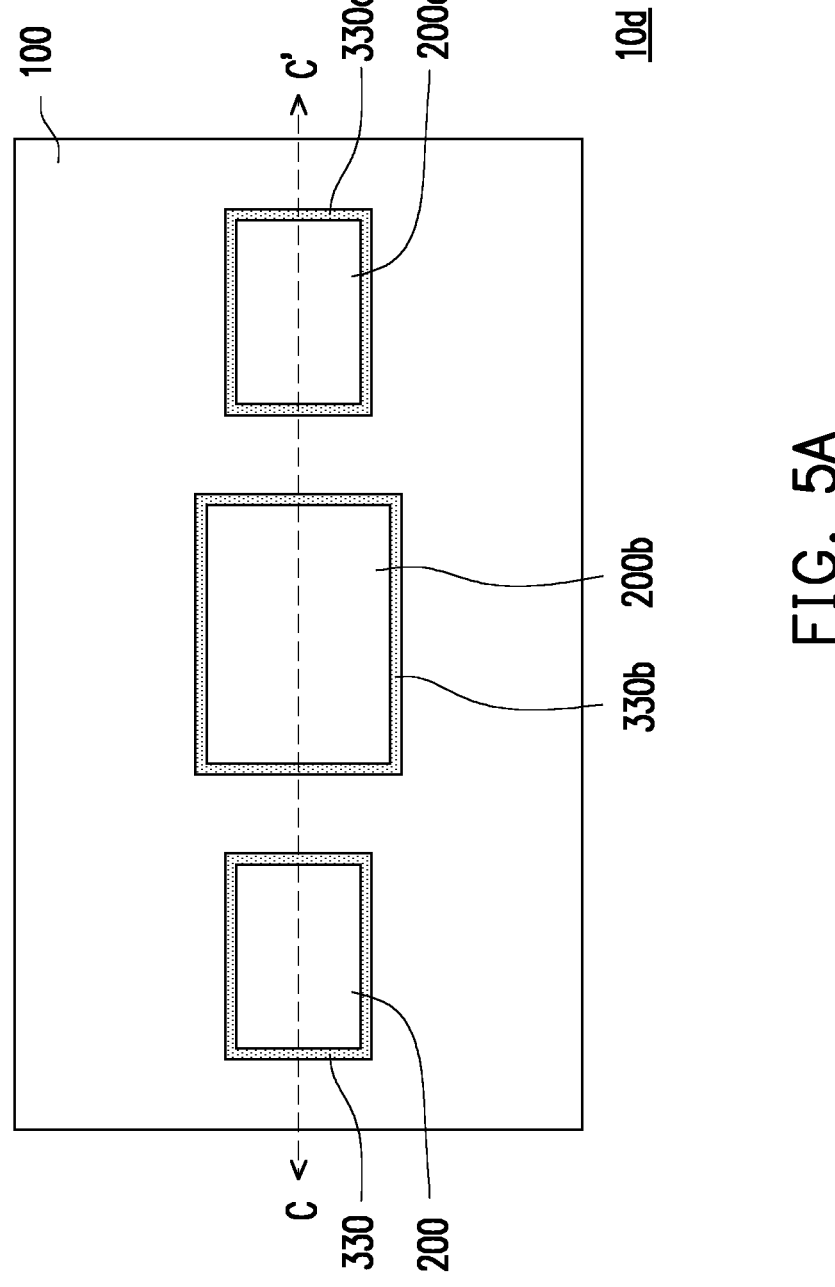
FIG. 5A is a schematic bottom view of a display device according to another embodiment of this disclosure.
Figure 6A:
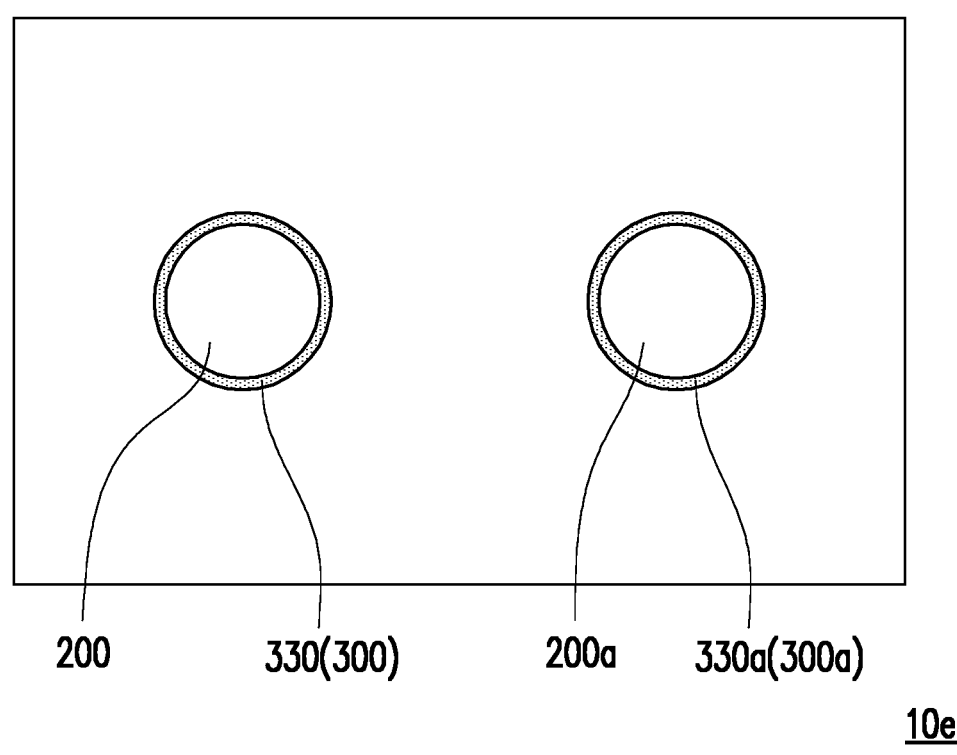
Figure 6B:
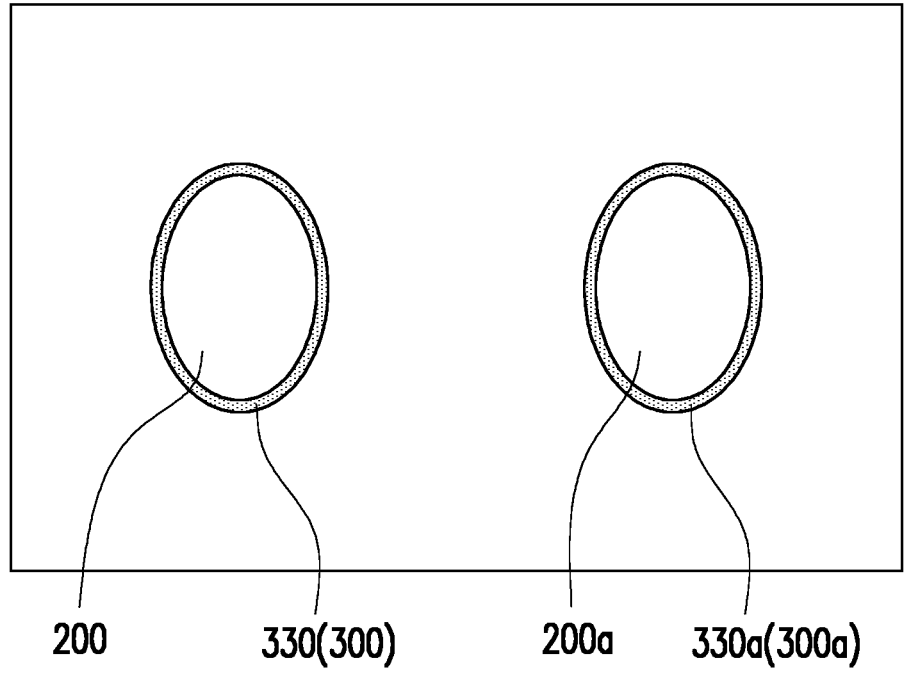
Figure 6C:
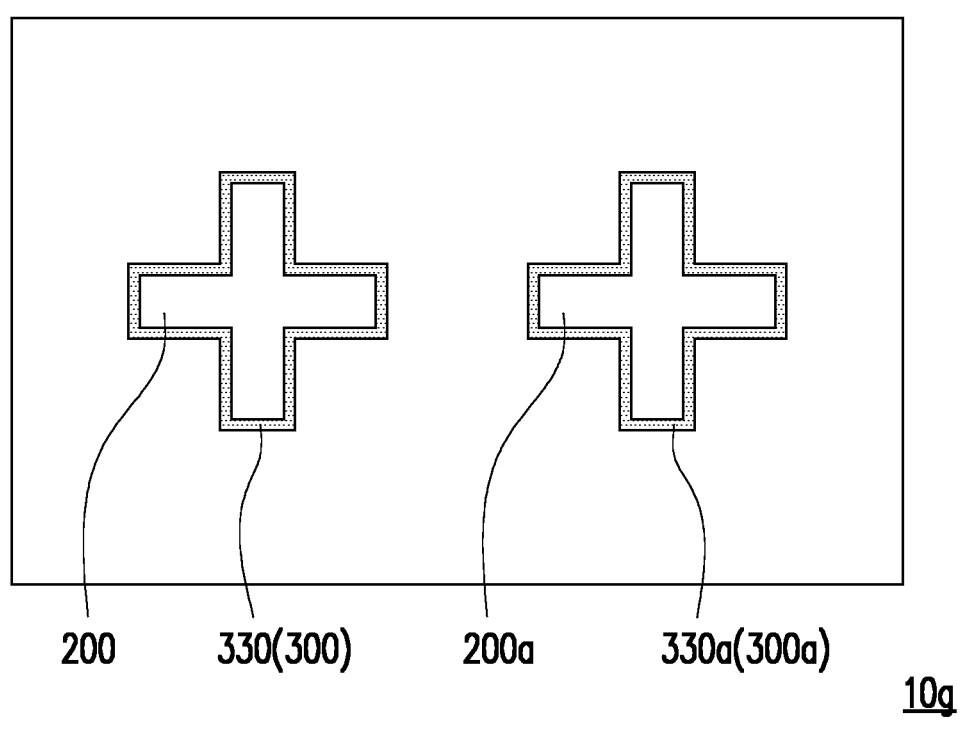
Figure 6D:
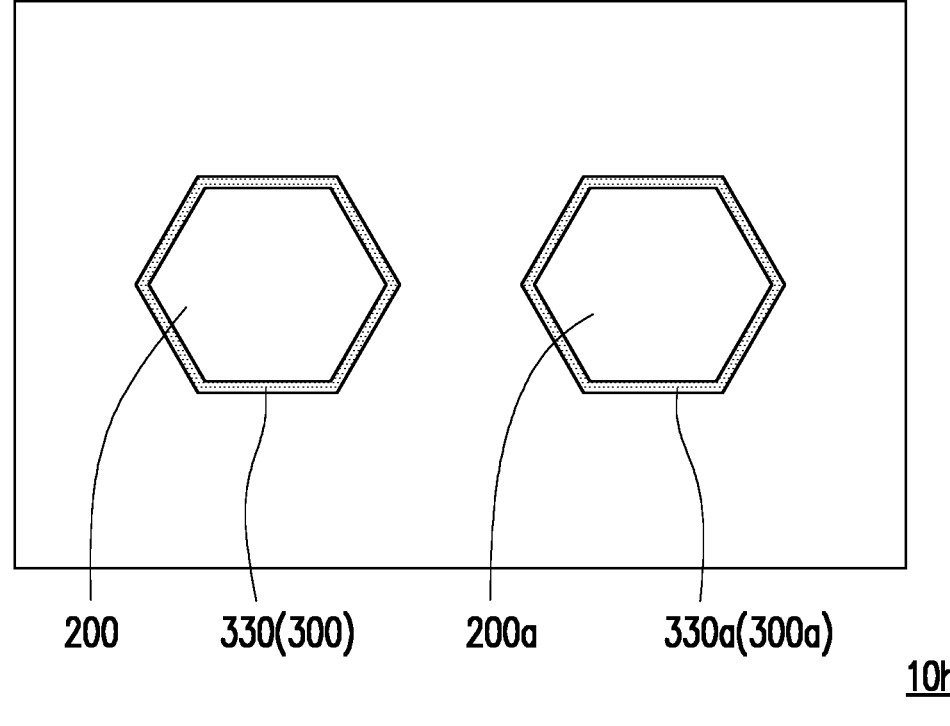

In the schematic bottom view of the display device 10 of this embodiment (as shown in FIG. 1A), only one combination including the intermediate layer 330 of the acoustic wave transmitting structure 300 and the corresponding acoustic wave generator 200 is shown, and a shape of such combination is a quadrilateral. Nonetheless, the number, shape, or size of the combination is not limited by the disclosure. That is to say, in some embodiments, two combinations (as shown in FIG. 4A, and FIG. 6A to FIG. 6E) or more than two combinations (as shown in FIG. 5A and FIG. 6F) including the intermediate layer of the acoustic wave transmitting structure and the inner layer of the corresponding acoustic wave generator may also be present. In some embodiments, sizes of multiple combinations including the intermediate layer of the acoustic wave transmitting structure and the inner layer of the corresponding acoustic wave generator may also be different from each other (as shown in FIG. 5A). In some embodiments, the shape of the combination including the intermediate layer of the acoustic wave transmitting structure and the inner layer of the corresponding acoustic wave generator may also include, but is not limited to, a circle (as shown in FIG. 6A), an ellipse (as shown in FIG. 6B), a cross (as shown in FIG. 6C), a hexagon (as shown in FIG. 6D), a polygon, a triangle (e.g., including a down-pointing triangle, as shown in FIG. 6E), an X-shape (as shown in FIG. 6F), or a combination of the above shapes (e.g., including a circle and an X-shape, as shown in FIG. 6F).

Briefly speaking, in the acoustic wave transmitting structure 300 and the display device 10 including the acoustic wave transmitting structure 300 according to the embodiment of the disclosure, through disposing the intermediate layer 330 of the acoustic wave transmitting structure 300 between the first layer 310 and the second layer 320, and causing the first acoustic impedance Z1 of the first layer 310, the second acoustic impedance Z2 of the second layer 320, and the third acoustic impedance Z3 of the intermediate layer 330 to satisfy the relation: $(Z1+Z2)/6.8 \leq Z3 \leq (Z1+Z2)/0.6$, the acoustic wave transmitting structure 300 and the display device 10 including the acoustic wave transmitting structure 300 maintain high sound intensity.

Several other embodiments will be provided hereinafter for description. It should be noted that the reference numerals and part of the contents in the foregoing embodiment will remain to be used in the following embodiments, in which the same components will be annotated with the same reference numerals, and the description of the same technical content will be omitted. For the omitted parts, reference may be made to the foregoing embodiment, and will not be repeatedly described in the following embodiments.

FIG. 2 is a schematic cross-sectional view of a display device according to another embodiment of this disclosure. With reference to FIG. 1B and FIG. 2 at the same time, a display device 10a of this embodiment is approximately similar to the display device 10 of FIG. 1B. Therefore, the same and similar components in the two embodiments are not repeatedly described herein. The difference between the display device 10a of this embodiment and the display device 10 mainly lies in that a display panel 100a of the display device 10a of this embodiment is a curved display panel.

FIG. 3 is a schematic cross-sectional view of a display device according to another embodiment of this disclosure. With reference to FIG. 1B and FIG. 3 at the same time, a display device 10b of this embodiment is approximately similar to the display device 10 of FIG. 1B. Therefore, the same and similar components in the two embodiments are not repeatedly described herein. The difference between the display device 10b of this embodiment and the display device 10 mainly lies in that the display device 10b of this embodiment also includes a first adhesive layer 410 and a second adhesive layer 420. The acoustic wave generator 200 is fixed to the display panel 100 through the first adhesive layer 410 and the second adhesive layer 420. The first adhesive layer 410 is in direct contact with the first surface 331 of the intermediate layer 330, and the second adhesive layer 420 is in direct contact with the second surface 332 of the intermediate layer 330. In this embodiment, the acoustic wave generated by the acoustic wave generator 200 is transmitted through the first adhesive layer 410, the intermediate layer 330, and the second adhesive layer 420 to the display panel. That is, the first adhesive layer 410, the intermediate layer 330, and second adhesive layer 420 may serve as an acoustic wave transmitting structure 300'.

Specifically, in this embodiment, a first layer 310' of the acoustic wave transmitting structure 300' is disposed between the substrate 110 of the display panel 100 and the intermediate layer 330 of the acoustic wave transmitting structure 300'. A second layer 320' of the acoustic wave transmitting structure 300' is disposed between the intermediate layer 330 of the acoustic wave transmitting structure 300' and the outer layer electrode 210 of the acoustic wave generator 200 that is adjacent to the intermediate layer 330. The first layer 310' and the second layer 320' are respectively located on the two opposite sides of the intermediate layer 330. The first layer 310' and the second layer 320' are separated from each other. The first layer 310' is in direct contact with the first surface 331 of the intermediate layer 330, and the second layer 320' is in direct contact with the second surface 332 of the intermediate layer 330.

Therefore, in the display device 10 of this embodiment, the first adhesive layer 410 serves as the first layer 310' of the acoustic wave transmitting structure 300', and the second adhesive layer 420 serves as the second layer 320' of the acoustic wave transmitting structure 300'. Nonetheless, the disclosure is not limited thereto. In other words, in the acoustic wave transmitting structure 300' of this embodiment, not only the substrate 110 of the display panel 100 does not serve as the first layer 310' of the acoustic wave transmitting structure 300', but the outer layer electrode 210 of the acoustic wave generator 200 that is adjacent to the intermediate layer 330 also does not serve as the second layer 320' of the acoustic wave transmitting structure 300'. In this embodiment, a material of the acoustic wave transmitting structure 300' may include, but is not limited to, an epoxy adhesive, an acrylic adhesive, silica gel, a double-sided tape, other suitable adhesive materials, or a combination of the above materials.

In this embodiment, the first layer 310' has a first acoustic impedance Z1, the second layer 320' has a second acoustic impedance Z2, and the intermediate layer 330 has a third acoustic impedance Z3. The first acoustic impedance Z1, the second acoustic impedance Z2, and the third acoustic impedance Z3 should satisfy a relation: $(Z1+Z2)/6.8 \leq Z3 \leq (Z1+Z2)/0.6$, or $0.6 \leq (Z1+Z2)/Z3 \leq 6.8$. Nonetheless, the disclosure is not limited thereto. In some embodiments, the first acoustic impedance Z1, the second acoustic impedance Z2, and the third acoustic impedance Z3 may also satisfy a relation: $(Z1+Z2)/4.7 \leq Z3 \leq (Z1+Z2)/0.9$, or $0.9 \leq (Z1+Z2)/Z3 \leq 4.7$. In some embodiments, the first acoustic impedance Z1, the second acoustic impedance Z2, and the third acoustic impedance Z3 may also satisfy a relation: $(Z1+Z2)/3.2 \leq Z3 \leq (Z1+Z2)/1.3$, or $1.3 \leq (Z1+Z2)/Z3 \leq 3.2$. In some embodiments, the first acoustic impedance Z1, the second acoustic impedance Z2, and the third acoustic impedance Z3 may also satisfy a relation: Z3 is equal to $(Z1+Z2)/2$, or $(Z1+Z2)/Z3$ is equal to 2. Thereby, a magnitude of a second sound intensity after penetrating the acoustic wave transmitting structure 300' is at least 50% or more of the magnitude of the first sound intensity emitted by the acoustic wave generator 200.

Figure 4A:
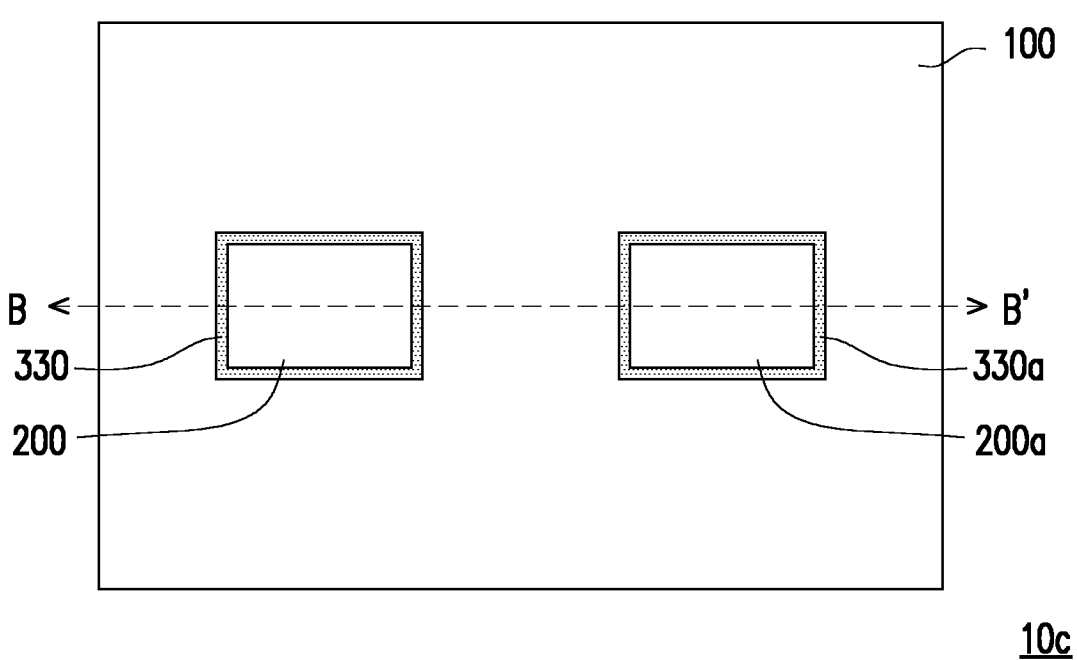
FIG. 4A is a schematic bottom view of a display device according to another embodiment of this disclosure.
Figure 4B:
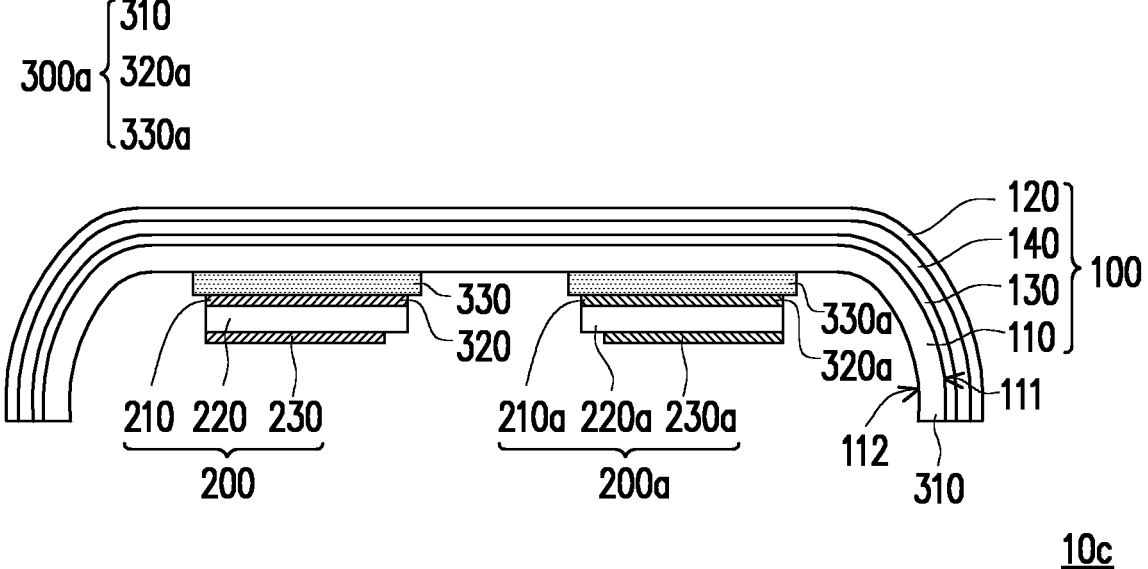
FIG. 4B is a schematic cross-sectional view of the display device of FIG. 4A along sectional line B-B'.

FIG. 4A is a schematic bottom view of a display device according to another embodiment of this disclosure. FIG. 4B is a schematic cross-sectional view of the display device of FIG. 4A along sectional line B-B'. For clarity of the drawings and convenience of description, FIG. 4A omits some elements in the display device. With reference to FIG. 1A to FIG. 1B and FIG. 4A to FIG. 4B at the same time, a display device 10c of this embodiment is approximately similar to the display device 10 of FIG. 1A to FIG. 1B. Therefore, the same and similar components in the two embodiments are not repeatedly described herein. The difference between the display device 10c of this embodiment and the display device 10 mainly lies in that the display device 10c of this embodiment also includes an acoustic wave generator 200a and an acoustic wave transmitting structure 300a.

With reference to FIG. 4A and FIG. 4B, specifically, in this embodiment, the acoustic wave generator 200a is disposed on the other side 112 of the substrate 110 of the display panel 100 through the acoustic wave transmitting structure 300a. The acoustic wave generator 200 is disposed adjacent to the acoustic wave generator 200a. The acoustic wave generator 200a has an outer layer electrode 210a, an inner layer 220a, and an outer layer electrode 230a. The acoustic wave transmitting structure 300a includes the first layer 310, a second layer 320a, and an intermediate layer 330a. Herein, the substrate 110 of the display panel 100 may serve as the first layer 310 of the acoustic wave transmitting structure 300a, and the outer layer electrode 210a of the acoustic wave generator 200a that is adjacent to the intermediate layer 330a may serve as the second layer 320a of the acoustic wave transmitting structure 300a. Nonetheless, the disclosure is not limited thereto. By this design, the display device 10c of this embodiment may serve as a display device having multiple audio channels, and having at least two audio channels that produce sounds.

In this embodiment, the acoustic wave generator 200 and the acoustic wave generator 200a are approximately similar in structure and material, and the acoustic wave transmitting structure 300 and the acoustic wave transmitting structure 300a are approximately similar in structure and material. Therefore, they are not repeatedly described herein. Besides, in the bottom view of the display device 10c (as shown in FIG. 4A), the display device 10c includes a first combination including the intermediate layer 330 of the acoustic wave transmitting structure 300 and the corresponding acoustic wave generator 200, and a second combination including the intermediate layer 330a of the acoustic wave transmitting structure 300a and the corresponding acoustic wave generator 200a. Herein, a shape of the first combination and a shape of the second combination may each be a quadrilateral, and a size of the first combination and a size of the second combination may be substantially the same. Nonetheless, the disclosure is not limited thereto.

Figure 5B:
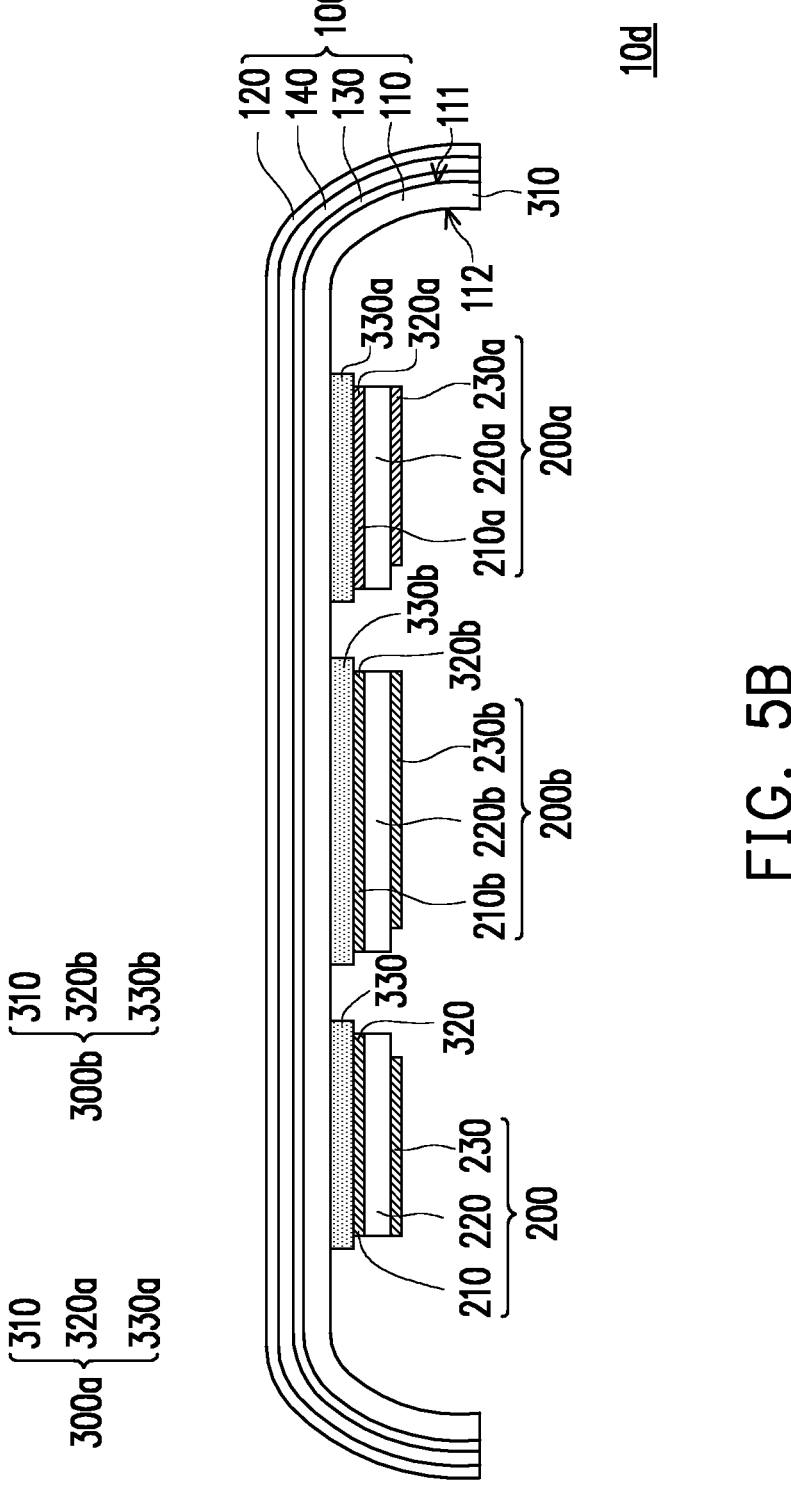
FIG. 5B is a schematic cross-sectional view of the display device of FIG. 5A along sectional line C-C'.

FIG. 5A is a schematic bottom view of a display device according to another embodiment of this disclosure. FIG. 5B is a schematic cross-sectional view of the display device of FIG. 5A along sectional line C-C'. For clarity of the drawings and convenience of description, FIG. 5A omits some elements in the display device. With reference to FIG. 4A to FIG. 4B and FIG. 5A to FIG. 5B at the same time, a display device 10d of this embodiment is approximately similar to the display device 10c of FIG. 4A to FIG. 4B. Therefore, the same and similar components in the two embodiments are not repeatedly described herein. The difference between the display device 10d of this embodiment and the display device 10c mainly lies in that the display device 10c of this embodiment also includes an acoustic wave generator 200b and an acoustic wave transmitting structure 300b.

With reference to FIG. 5A and FIG. 5B, specifically, in this embodiment, the acoustic wave generator 200b is disposed on the other side 112 of the substrate 110 of the display panel 100 through the acoustic wave transmitting structure 300b. The acoustic wave generator 200b is disposed adjacent to the acoustic wave generator 200, the acoustic wave generator 200b is disposed adjacent to the acoustic wave generator 200a, and the acoustic wave generator 200b is disposed between the acoustic wave generator 200 and the acoustic wave generator 200a. The acoustic wave generator 200b has an outer layer electrode 210b, an inner layer 220b, and an outer layer electrode 230b. The acoustic wave transmitting structure 300b includes the first layer 310, a second layer 320b, and an intermediate layer 330b. Herein, the substrate 110 of the display panel 100 may serve as the first layer 310 of the acoustic wave transmitting structure 300b, and the outer layer electrode 210b of the acoustic wave generator 200b that is adjacent to the intermediate layer 330b may serve as the second layer 320b of the acoustic wave transmitting structure 300b. Nonetheless, the disclosure is not limited thereto.

In this embodiment, the acoustic wave generator 200b and the acoustic wave generators 200 and 200a are approximately similar in structure and material, and the acoustic wave transmitting structure 300b and the acoustic wave transmitting structures 300 and 300a are approximately similar in structure and material. Therefore, they are not repeatedly described herein. Besides, in the bottom view of the display device 10d (as shown in FIG. 5A), the display device 10d includes the first combination including the intermediate layer 330 of the acoustic wave transmitting structure 300 and the corresponding acoustic wave generator 200, the second combination including the intermediate layer 330a of the acoustic wave transmitting structure 300a and the corresponding acoustic wave generator 200a, and a third combination including the intermediate layer 330b of the acoustic wave transmitting structure 300b and the corresponding acoustic wave generator 200b. Herein, the shape of the first combination, the shape of the second combination, and a shape of the third combination may each be a quadrilateral, the size of the first combination and the size of the second combination may be substantially the same, and a size of the third combination may be larger than the size of the first combination and the size of the second combination. Nonetheless, the disclosure is not limited thereto. By this design, the display device 10d of this embodiment may serve as a display device having multiple audio channels, and having at least three audio channels that produce sounds. Herein, the acoustic wave generator 200b may be employed as the main channel, and the acoustic wave generator 200 and the acoustic wave generator 200a may be employed as the sub-channels. Nonetheless, the disclosure is not limited thereto.

FIG. 6A to FIG. 6F are schematic bottom views of display devices according to some embodiments of the disclosure. With reference to FIG. 4A and FIG. 6A to FIG. 6E at the same time, display devices 10e, 10f, 10g, 10h, and 10i of these embodiments are approximately similar to the display device 10c of FIG. 4A. Therefore, the same and similar components in the embodiments are not repeatedly described herein. The difference between the display devices 10e, 10f, 10g, 10h, and 10i of these embodiments and the display device 10c mainly lies in the following.

In the display device 10e according to an embodiment of the disclosure, the display device 10e includes the first combination including the intermediate layer 330 of the acoustic wave transmitting structure 300 and the corresponding acoustic wave generator 200, and the second combination including the intermediate layer 330a of the acoustic wave transmitting structure 300a and the corresponding acoustic wave generator 200a. Herein, the shape of the first combination and the shape of the second combination may each be a circle. Nonetheless, the disclosure is not limited thereto.

In the display device 10f according to an embodiment of the disclosure, the display device 10f includes the first combination including the intermediate layer 330 of the acoustic wave transmitting structure 300 and the corresponding acoustic wave generator 200, and the second combination including the intermediate layer 330a of the acoustic wave transmitting structure 300a and the corresponding acoustic wave generator 200a. Herein, the shape of the first combination and the shape of the second combination may each be an ellipse. Nonetheless, the disclosure is not limited thereto.

In the display device 10g according to an embodiment of the disclosure, the display device 10g includes the first combination including the intermediate layer 330 of the acoustic wave transmitting structure 300 and the corresponding acoustic wave generator 200, and the second combination including the intermediate layer 330a of the acoustic wave transmitting structure 300a and the corresponding acoustic wave generator 200a. Herein, the shape of the first combination and the shape of the second combination may each be a cross. Nonetheless, the disclosure is not limited thereto.

In the display device 10*h* according to an embodiment of the disclosure, the display device 10*h* includes the first combination including the intermediate layer 330 of the acoustic wave transmitting structure 300 and the corresponding acoustic wave generator 200, and the second combination including the intermediate layer 330*a* of the acoustic wave transmitting structure 300*a* and the corresponding acoustic wave generator 200*a*. Herein, the shape of the first combination and the shape of the second combination may each be a hexagon. Nonetheless, the disclosure is not limited thereto.

In the display device 10*i* according to an embodiment of the disclosure, the display device 10*i* includes the first combination including the intermediate layer 330 of the acoustic wave transmitting structure 300 and the corresponding acoustic wave generator 200, and the second combination including the intermediate layer 330*a* of the acoustic wave transmitting structure 300*a* and the corresponding acoustic wave generator 200*a*. Herein, the shape of the first combination and the shape of the second combination may each be a triangle. In addition, the shape of the first combination may be an upright triangle, and the shape of the second combination may be a down-pointing triangle. Nonetheless, the disclosure is not limited thereto.

Next, with reference to FIG. 5A and FIG. 6F at the same time, a display device 10*j* according to an embodiment of the disclosure is approximately similar to the display device 10*d* of FIG. 5A. Therefore, the same and similar components in the two embodiments are not repeatedly described herein. The difference between the display device 10*j* of this embodiment and the display device 10*d* mainly lies in that the display device 10*j* includes the first combination including the intermediate layer 330 of the acoustic wave transmitting structure 300 and the corresponding acoustic wave generator 200, the second combination including the intermediate layer 330*a* of the acoustic wave transmitting structure 300*a* and the corresponding acoustic wave generator 200*a*, and the third combination including the intermediate layer 330*b* of the acoustic wave transmitting structure 300*b* and the corresponding acoustic wave generator 200*b*. Herein, the shape of the first combination and the shape of the second combination may each be a circle, and the shape of the third combination may be an X-shape. Nonetheless, the disclosure is not limited thereto.

By this design, the acoustic wave transmitting structures 300, 300*a*, and 300*b* and the corresponding acoustic wave generators 200, 200*a*, and 200*b* in the display devices 10*e*, 10*f*, 10*g*, 10*h*, 10*i*, and 10*j* may have different shape variations and/or areas, so that the sounds emitted by the display devices 10*e*, 10*f*, 10*g*, 10*h*, 10*i*, and 10*j* are, for example, relatively three-dimensional, wide, or broad. Nonetheless, the disclosure is not limited thereto.

In summary of the foregoing, in the acoustic wave transmitting structure and the display device including the acoustic wave transmitting structure according to the embodiment of this disclosure, through disposing the intermediate layer of the acoustic wave transmitting structure between the first layer and the second layer, and causing the first acoustic impedance Z1 of the first layer, the second acoustic impedance Z2 of the second layer, and the third acoustic impedance Z3 of the intermediate layer to satisfy the relation: $(Z1+Z2)/6.8 \leq Z3 \leq (Z1+Z2)/0.6$, the acoustic wave transmitting structure 300 and the display device 10 including the acoustic wave transmitting structure 300 maintain high sound intensity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
a display panel having a substrate, wherein a plurality of display elements are disposed on one side of the substrate; and
an acoustic wave generator disposed on the other side of the substrate of the display panel through an acoustic wave transmitting structure, wherein the other side of the substrate is opposite to the one side of the substrate,
wherein the acoustic wave transmitting structure is disposed between the display panel and the acoustic wave generator,
wherein the acoustic wave transmitting structure further comprises:
a first layer having a first acoustic impedance Z1;
a second layer having a second acoustic impedance Z2; and
an intermediate layer disposed between the first layer and the second layer and having a third acoustic impedance Z3,
wherein the intermediate layer comprises a first surface and a second surface opposite to each other, the first layer is in direct contact with the first surface of the intermediate layer, and the second layer is in direct contact with the second surface of the intermediate layer,
wherein a material of the intermediate layer comprises an epoxy adhesive, an acrylic adhesive, or silica gel,
wherein Z1, Z2, and Z3 satisfy a relation: $(Z1+Z2)/6.8 \leq Z3 \leq (Z1+Z2)/0.6$,
wherein the acoustic wave generator has an outer layer, an inner layer and another outer layer, the inner layer is disposed between the outer layer and the another outer layer, the outer layer is closer to the acoustic wave transmitting structure than the another outer layer, the inner layer is a piezoelectric layer, and the outer layer and the another outer layer are electrodes,
wherein the intermediate layer is disposed between the substrate of the display panel and the outer layer of the acoustic wave generator.

2. The display device according to claim 1, wherein Z1, Z2, and Z3 satisfy a relation:

$$(Z1+Z2)/4.7 \leq Z3 \leq (Z1+Z2)/0.9.$$

3. The display device according to claim 1, wherein Z1, Z2, and Z3 satisfy a relation:

$$(Z1+Z2)/3.2 \leq Z3 \leq (Z1+Z2)/1.3.$$

4. The display device according to claim 1, wherein Z3 is equal to $(Z1+Z2)/2$.

5. The display device according to claim 1, wherein the substrate of the display panel serves as the first layer of the acoustic wave transmitting structure.

6. The display device according to claim 1, wherein the outer layer serves as the second layer of the acoustic wave transmitting structure.

7. The display device according to claim 5, wherein the outer layer serves as the second layer of the acoustic wave transmitting structure.

\* \* \* \* \*